United States Patent
Ammon et al.

(10) Patent No.: US 8,475,592 B2
(45) Date of Patent: Jul. 2, 2013

(54) METHOD FOR PRODUCING A SINGLE CRYSTAL OF SEMICONDUCTOR MATERIAL

(75) Inventors: Wilfried von Ammon, Hochburg (AT); Ludwig Altmannshofer, Massing (DE); Helge Riemann, Schulzendorf (DE); Joerg Fischer, Berlin (DE)

(73) Assignee: Siltronic AG, Munich (DE)

( * ) Notice: Subject to any disclaimer, the term of this patent is extended or adjusted under 35 U.S.C. 154(b) by 924 days.

(21) Appl. No.: 12/539,011

(22) Filed: Aug. 11, 2009

(65) Prior Publication Data

US 2010/0037815 A1 Feb. 18, 2010

(30) Foreign Application Priority Data

Aug. 13, 2008 (DE) .......................... 10 2008 038 810

(51) Int. Cl.
| | |
|---|---|
| C30B 11/00 | (2006.01) |
| C30B 9/00 | (2006.01) |
| C30B 17/00 | (2006.01) |
| C30B 21/02 | (2006.01) |
| C30B 28/06 | (2006.01) |
| C30B 35/00 | (2006.01) |

(52) U.S. Cl.
USPC .................. 117/74; 117/11; 117/73; 117/83; 117/200

(58) Field of Classification Search
USPC .................. 117/74, 11, 73, 83, 200
See application file for complete search history.

(56) References Cited

U.S. PATENT DOCUMENTS

| 5,133,829 | A | * | 7/1992 | Geyling | ........................... 117/46 |
| 5,217,565 | A | * | 6/1993 | Kou et al. | ...................... 75/10.11 |
| 6,942,730 | B2 | * | 9/2005 | Han | ................................ 117/81 |
| 7,655,089 | B2 | * | 2/2010 | von Ammon | .................... 117/33 |
| 8,221,550 | B2 | * | 7/2012 | von Ammon | .................. 117/214 |
| 2003/0145781 | A1 | * | 8/2003 | Von Ammon | ..................... 117/49 |

FOREIGN PATENT DOCUMENTS

| DE | 10204178 A1 | 9/2003 |
| JP | 11-189486 A | 7/1999 |
| JP | 11292682 A | 10/1999 |

* cited by examiner

Primary Examiner — James McDonough
(74) Attorney, Agent, or Firm — Brooks Kushman P.C.

(57) ABSTRACT

A single crystal of semiconductor material is produced by a method of melting semiconductor material granules by means of a first induction heating coil on a dish with a run-off tube consisting of the semiconductor material, forming a melt of molten granules which extends from the run-off tube in the form of a melt neck and a melt waist to a phase boundary, delivering heat to the melt by means of a second induction heating coil which has an opening through which the melt neck passes, crystallizing the melt at the phase boundary, and delivering a cooling gas to the run-off tube and to the melt neck in order to control the axial position of an interface between the run-off tube and the melt neck.

6 Claims, 1 Drawing Sheet

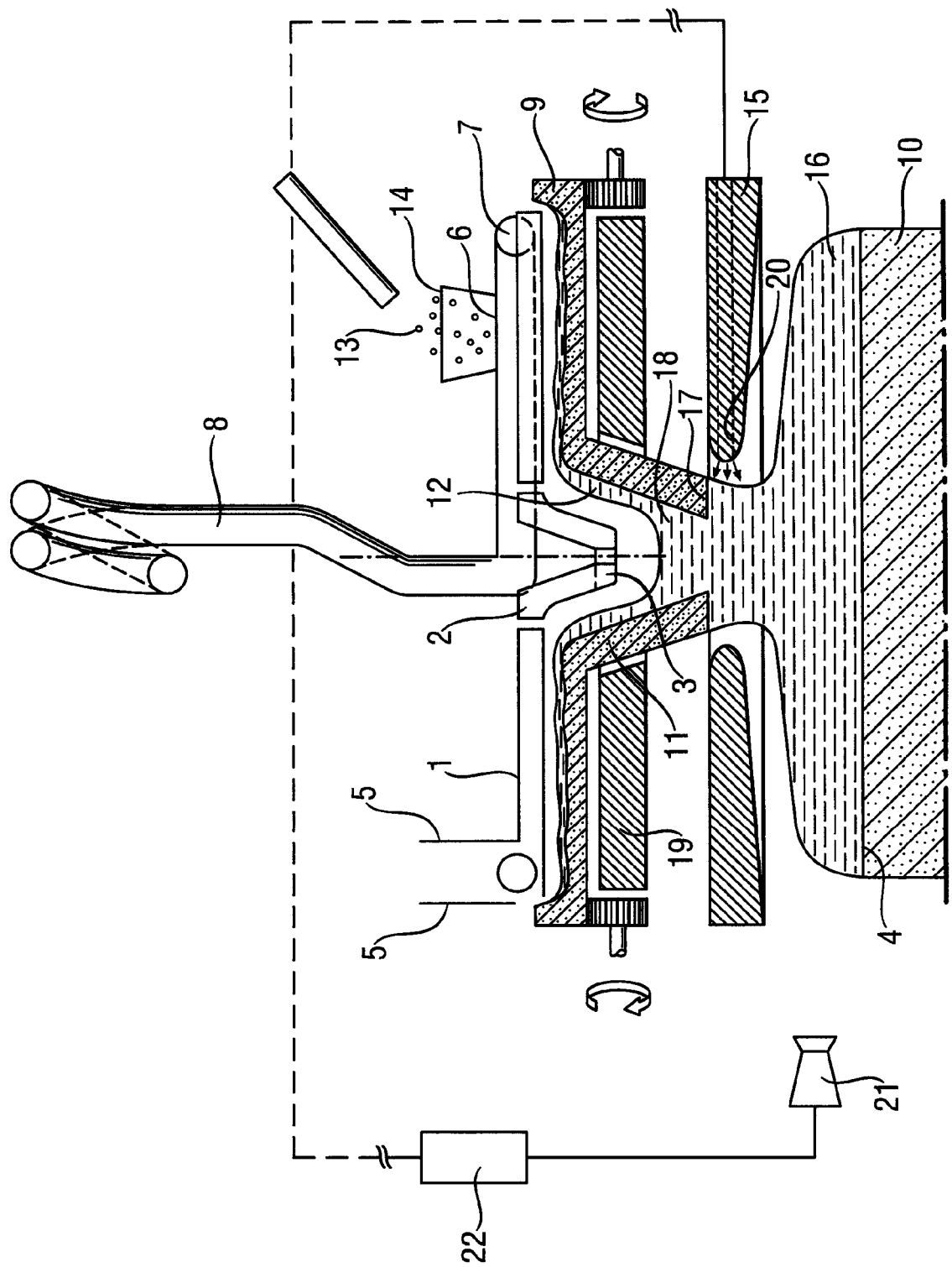

METHOD FOR PRODUCING A SINGLE CRYSTAL OF SEMICONDUCTOR MATERIAL

CROSS-REFERENCE TO RELATED APPLICATIONS

This application claims priority to German application DE 10 2008 038810.6 filed Aug. 13, 2008, which is herein incorporated by reference.

BACKGROUND OF THE INVENTION

1. Field of the Invention

The invention relates to a method for producing a single crystal of semiconductor material, in which semiconductor material granules are melted on a dish that has a run-off tube consisting of the semiconductor material, and a melt of molten granules is formed, which extends from the run-off tube in the form of a melt neck and a melt waist to a phase boundary, and heat is delivered to the melt by means of an induction heating coil which has an opening through which the melt neck passes, and the melt is crystallized at the phase boundary.

2. Background Art

Such a method is described, for example, in US 2003145781 A. It makes it possible to produce a single crystal of semiconductor material with granules as raw material. FIG. 4 of US 2003145781 A shows a device which is suitable for carrying out the method. The granules are melted on a dish, in the middle of which there is a passage opening extended to a run-off tube. A first induction heating coil, arranged above the dish, is used to melt the granules. The molten granules form initially a film, and in the further course of the method, a melt which crystallizes at a phase boundary and thereby increases the volume of the growing single crystal. The crystallizing volume is compensated for by a corresponding volume of newly melted granules. The melt extends from the run-off tube to the phase boundary, at which the single crystal grows. In the region of the run-off tube, it has the form of a melt neck which passes through the opening of a second induction heating coil and merges into a wider melt waist, which lies on the growing single crystal. With the aid of the second induction heating coil, heat is delivered to the melt in order to control the growth of the single crystal.

Since the run-off tube consists of the semiconductor material, it may be caused to melt by the second induction heating coil if the energy input is correspondingly high. On the other hand, the run-off tube may grow downward if the energy provided by the second induction heating coil is not sufficient to keep the melt liquid in the region of the run-off tube. The position of the interface between the run-off tube and the melt must not however be displaced arbitrarily far axially, i.e. upward or downward. If the interface migrates too far upward because the run-off tube is melted, the volume of the melt neck increases and the risk arises that the melt will touch the second induction heating coil or the melt neck will become too thin and break. If the interface migrates too far downward because the run-off tube grows in this direction, the risk arises that the run-off tube will freeze up and block the melt flow. These two situations must not occur, because they prevent further growth of the single crystal.

SUMMARY OF THE INVENTION

It is therefore an object of the invention to provide a method so that more effective control of the axial position of the interface is possible. This and other objects are achieved by a method for producing a single crystal of semiconductor material, comprising melting of semiconductor material granules by means of a first induction heating coil on a dish with a run-off tube consisting of the semiconductor material, forming a melt of molten granules which extends from the run-off tube in the form of a melt neck and a melt waist to a phase boundary; delivering heat to the melt by means of a second induction heating coil which has an opening through which the melt neck passes; crystallizing the melt at the phase boundary; and delivering a cooling gas to the run-off tube and to the melt neck in order to control the axial position of an interface between the run-off tube and the melt neck. The objects are furthermore achieved by a device for producing a single crystal of semiconductor material, which comprises a dish for receiving granules of semiconductor material, the dish having an opening at its center, which is extended to a run-off tube; a first induction heating coil for melting the granules on the dish; a second induction heating coil for transferring energy to a melt formed by the molten granules, the second induction heating coil having a passage opening for the melt at its center; and an instrument for the controlled delivery of a gas into a region where a melt neck of the melt and the run-off tube touch.

BRIEF DESCRIPTION OF THE DRAWINGS

FIG. 1 shows a device which is particularly suitable for carrying out the method of the invention.

DETAILED DESCRIPTION OF THE PREFERRED EMBODIMENT(S)

Granules 13 from a funnel are melted on a rotatable dish 9, in the middle of which there is a passage opening extended to a run-off tube 11. A first induction heating coil, arranged above the dish, is used to melt the granules 13. The first induction heating coil is preferably designed so that radiofrequency current, which is supplied through coil terminals 5, essentially flows through a coil former 1 and segments 2. The segments are electrically conductively connected to one another at their lower end through a thin bar 3. The coil former 1 has radially directed current guide slots, which force current to flow on a meandering path through the coil former. This ensures that all regions of the surface of the rotating dish are covered uniformly by the electromagnetic field. In an outer region, the coil former 1 has at least one passage opening 6 for delivering the semiconductor material granules 13 onto the rotating dish 9. The first induction heating coil is furthermore equipped with a cooling system which, in the coil former 1, comprises cooling channels 7 through which a coolant flows, for example water. So that intense cooling of the segments 2 can also be obtained, the cooling channels continue up to the segments and are connected together by a bridging tube 8. The bridging tube extends at the centre of the upper side of the coil former 1 as far as the segments 2, and is for example soldered or welded onto them. The bridging tube 8 is wound one or more times, so that it has a sufficiently high inductance. The radiofrequency current therefore flows essentially through the bar 3, which connects the segments 2, and not through the bridging tube 8. Owing to the flow of current, the field line density is particularly high in the region of the bar and the inductive heating of the melt's part which lies directly opposite the bar 3 during production of the single crystal 10, is particularly effective. Preferably the same electrical potential, most preferably ground potential, is applied to the melt and the bar.

The dish 9 consists of the same semiconductor material as the granules 13 and is preferably configured in a manner like the container which is described in DE 102 04 178 A1, the content of which is hereby incorporated by reference. It may however also be configured as a simple flat plate with a central run-off tube.

In the course of the method, the granules form a melt which may be subdivided into a continuous film 12, a melt neck 18 and a melt waist 16. The melt crystallizes at a phase boundary 4 and thereby increases the volume of the growing crystal 10. The crystallizing volume is compensated for by a corresponding volume of newly melted granules. The melt neck 18 extends from the lower end of the run-off tube 11 as far as the melt waist 16, and passes through the opening of a second induction heating coil 15. The melt waist 16, which is wider than the melt neck, bears on the growing single crystal 10. With the aid of the second induction heating coil 15, heat is delivered to the melt in order to control the growth of the single crystal 10. A shield 19, which preferably consists of an actively cooled metal plate, is arranged between the induction heating coils in order to shield them electromagnetically from one another. Furthermore, the shield 19 cools the bottom of the dish 9.

In order to carry out the method according to the invention, an instrument is provided which permits controlled delivery of a cooling gas to the run-off tube 11 and to the melt neck 18 in the region of an interface 17 between the run-off tube and the melt neck. In the embodiment represented, the instrument comprises a nozzle 20 through which the cooling gas, preferably argon, is fed from the side to the run-off tube 11 and to the melt neck 18. The nozzle 20 is preferably integrated into the second induction heating coil. It may however also be accommodated in or on the shield 19. The instrument furthermore comprises a camera 21 for optical acquisition of the axial position of the interface 17, and a controller 22 for supplying the nozzle with the cooling gas. The camera, the nozzle and the control are connected to form a control loop. The axial position of the interface is identified by the camera from the pronounced difference in brightness between the run-off tube and the melt. The controller, preferably a PID controller (combination of proportional, integral and differential controllers) controls the volume flow of the gas through the nozzle as a function of the detected position of the interface 17. If the interface 17 migrates upward beyond a tolerated upper limit position, the controller increases the volume flow so that semiconductor material solidifies at the end of the run-off tube owing to the enhanced cooling effect, and the run-off tube is lengthened. The effect of this is to displace the interface 17 downward. If the interface 17 migrates downward below a tolerated lower limit position, the controller decreases the volume flow so that the run-off tube is melted at its lower end owing to the reduced cooling effect. The effect of this is to displace the interface upward.

The distance from the middle of the second induction heating coil 15 to the upper and lower limit positions is preferably not more than 10 mm, more preferably not more than 5 mm. The axial position of the interface 17 is thus controlled so that the interface 17 preferably remains within a region with an axial length of less than 20 mm, more preferably 10 mm.

The control may be assisted by displacing the second induction heating coil 15 to the side, so that the melt neck 18 no longer passes through the opening of the second induction heating coil axisymmetrically with the rotation axis of the dish and the single crystal. This measure is advantageous particularly in the phase in which the diameter of the single crystal is widened to a final diameter. The closer the second induction heating coil comes to the melt neck, the greater is the integral energy input i.e. the amount of energy supplied in total to the melt neck. Additional energy input takes place when the second induction heating coil approaches the melt neck, although with lateral displacement of the induction heating coil the distance on one side of the melt neck decreases, but at the same time increases on the opposite side of the melt neck. Lateral displacement of the second induction heating coil, from a position in which the melt neck passes axisymmetrically to the opening of the coil, toward the melt neck thus qualitatively has the same effect as reducing the volume flow of the cooling gas through the nozzle.

EXAMPLE

In order to demonstrate the success of the invention, a plurality of silicon single crystals with diameters of 70 mm, 105 mm and 150 mm were produced in a device according to FIG. 1.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing a single crystal of semiconductor material, comprising
    melting semiconductor material granules by means of a first induction heating coil on a dish with a run-off tube consisting of the semiconductor material;
    forming a melt of molten granules which extends from the run-off tube in the form of a melt neck and a melt waist to a phase boundary;
    delivering heat to the melt by means of a second induction heating coil, which has an opening through which the melt neck passes;
    crystallizing the melt at the phase boundary; and
    controlling the axial position of an interface between the run-off tube and the melt neck by controlling the delivery of a cooling gas to the run-off tube and to the melt neck.

2. The method of claim 1, wherein the axial position of the interface is controlled so that it remains in a region with an axial length of less than 20 mm.

3. The method of claim 1, wherein the axial position of the interface is modified by displacing the second induction heating coil toward the melt neck.

4. The method of claim 2, wherein the axial position of the interface is modified by displacing the second induction heating coil toward the melt neck.

5. The method of claim 1, further comprising cooling the dish and electromagnetically shielding the first induction coil and second induction coil from each other by an actively cooled metal plate positioned below the dish and above the second induction coil.

6. The method of claim 1, wherein the cooling gas is supplied through a nozzle integrated into the second induction coil.

* * * * *